(12) United States Patent
Zuckerman

(10) Patent No.: US 8,750,441 B2
(45) Date of Patent: Jun. 10, 2014

(54) SIGNAL CANCELLATION TO REDUCE PHASE NOISE, PERIOD JITTER, AND OTHER CONTAMINATION IN LOCAL OSCILLATOR, FREQUENCY TIMING, OR OTHER TIMING GENERATORS OR SIGNAL SOURCES

(75) Inventor: Lawrence H. Zuckerman, Livermore, CA (US)

(73) Assignee: Texas Instruments Incorporated, Dallas, TX (US)

( * ) Notice: Subject to any disclaimer, the term of this patent is extended or adjusted under 35 U.S.C. 154(b) by 137 days.

(21) Appl. No.: 13/329,533

(22) Filed: Dec. 19, 2011

(65) Prior Publication Data

US 2012/0154031 A1    Jun. 21, 2012

Related U.S. Application Data

(60) Provisional application No. 61/425,104, filed on Dec. 20, 2010.

(51) Int. Cl.
    *H03K 5/00* (2006.01)
(52) U.S. Cl.
    USPC ........... 375/349; 375/346; 375/322; 375/324; 327/551; 332/103; 455/258; 455/324
(58) Field of Classification Search
    USPC ............ 375/349, 97, 346, 322, 324; 327/551; 455/258, 324; 332/103
    See application file for complete search history.

(56) References Cited

U.S. PATENT DOCUMENTS

| | | | |
|---|---|---|---|
| 3,800,228 A * | 3/1974 | Acker | 375/346 |
| 5,206,886 A | 4/1993 | Bingham | |
| 5,430,770 A | 7/1995 | Abbey | |
| 5,867,771 A * | 2/1999 | Ruitenburg | 455/86 |
| 6,337,888 B1 | 1/2002 | Huang et al. | |
| 2004/0051598 A1 | 3/2004 | Vann et al. | |
| 2010/0241913 A1* | 9/2010 | Sheth et al. | 714/704 |

OTHER PUBLICATIONS

Arvin R. Shahani, et al., "Low-Power Dividerless Frequency Synthesis Using Aperture Phase Detection", IEEE Journal of Solid-State Circuits, vol. 33, No. 12, Dec. 1998, p. 2232-2239.

* cited by examiner

*Primary Examiner* — Michael Neff
(74) *Attorney, Agent, or Firm* — Andrew Viger; Wade J. Brady, III; Frederick J. Telecky, Jr.

(57) ABSTRACT

A method includes obtaining an input signal and demodulating phase contamination in the input signal to generate a baseband signal. The method also includes modulating the input signal based on the baseband signal to generate an output signal, where the output signal has less phase contamination than the input signal. The phase contamination could be demodulated using a phase demodulator or a frequency modulation (FM) detector. A portion of the input signal could be down-converted to a lower frequency, and the phase contamination in the down-converted portion of the input signal could be demodulated. Additional phase contamination in the output signal can be demodulated and used to regulate a level of the baseband signal used during modulation of the input signal. The output signal could have less phase noise or period jitter than the input signal.

17 Claims, 14 Drawing Sheets

SIGNAL CANCELLATION TO REDUCE PHASE NOISE, PERIOD JITTER, AND OTHER CONTAMINATION IN LOCAL OSCILLATOR, FREQUENCY TIMING, OR OTHER TIMING GENERATORS OR SIGNAL SOURCES

CROSS-REFERENCE TO RELATED APPLICATION AND PRIORITY CLAIM

This application claims priority under 35 U.S.C. §119(e) to U.S. Provisional Patent Application No. 61/425,104 filed on Dec. 20, 2010, which is hereby incorporated by reference.

TECHNICAL FIELD

This disclosure relates generally to timing generators and other signal sources. More specifically, this disclosure relates to signal cancellation to reduce phase noise, period jitter, and other contamination in local oscillator, frequency timing, or other timing generators or signal sources.

BACKGROUND

Phase noise, period jitter, other noise, and spurious deterministic contamination of local oscillators and other timing generators, such as phase locked loop (PLL) frequency synthesizers, are often key specifications. Among other things, the amount of phase noise or period jitter affects spectral usage efficiency and the ability to encode and decode high-speed data with minimal errors. Massive efforts have been made over the years to reduce phase noise, period jitter, other noise, and spurious deterministic contamination in local oscillators and other timing generators.

BRIEF DESCRIPTION OF DRAWINGS

For a more complete understanding of this disclosure and its features, reference is now made to the following description, taken in conjunction with the accompanying drawings, in which.

DETAILED DESCRIPTION

FIG. 1 through 13, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

In general, this disclosure provides techniques for reduction or cancellation of phase noise, period jitter, and/or other contamination by processing a source signal after the source signal has been generated. The techniques generally involve demodulating a source signal's phase noise and other contamination to baseband, inverting the baseband signal, and using the inverted baseband signal to modulate the source signal. This technique, when applied to and/or further integrated with phase locked loop (PLL) synthesizers or other products, can substantially reduce phase noise, period jitter, and other contamination, even for those sources that provide narrow channel spacing. Note that phase noise and angle-modulated contamination appear as phase/frequency modulation of the source signal.

Depending on the implementation, these techniques can provide significant benefits in a range of fields, such as any field in which timing generator (clock) products are used. The timing generator products could include clock generation, conditioning, and distribution products. As particular examples, these techniques could be used with radio frequency (RF) and low frequency equipment's local oscillator sources and digital communication frequency timing generators. It could also be used with a wide variety of other systems and components requiring low to extremely low phase noise and other contamination levels, such as analog-to-digital and digital-to-analog converters.

Note that in the following discussion, these techniques are described as being used for reducing phase noise or period jitter in a signal by demodulation of phase noise in the signal to baseband. However, these techniques could be used to reduce various other types of contamination that angle-modulate a monochromatic source. Among other things, this can substantially reduce both phase noise and spurious components (such as, but not limited to, PLL reference sidebands and special varieties of unwanted components introduced by fractional N, sigma-delta, and direct digital synthesizers) in a wide range of monochromatic sources.

Figure 1:
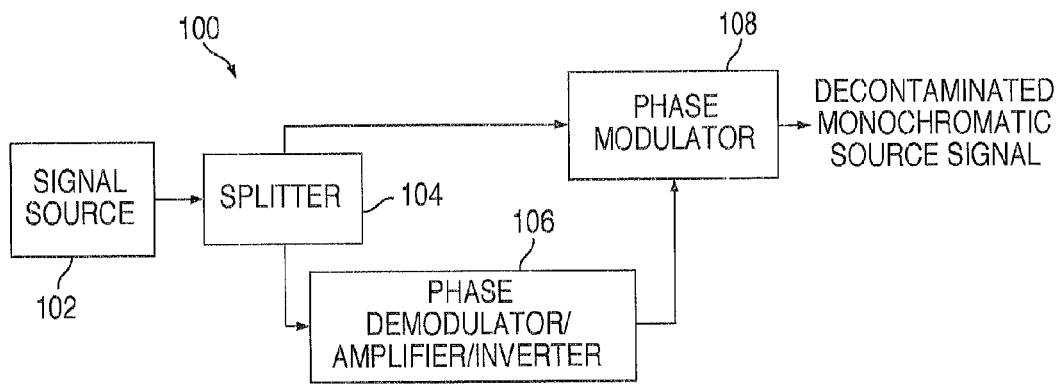
FIGS. 1 through 4 illustrate example systems for performing signal cancellation to reduce phase contamination of a signal using phase detection and related details according to this disclosure.

FIGS. 1 through 4 illustrate example systems for performing signal cancellation to reduce phase contamination of a signal using phase detection and related details according to this disclosure. As shown in FIG. 1, a system 100 includes a signal source 102, which provides a source signal for further processing. The signal source 102 includes any suitable structure that provides a signal needing reduction of phase modulation contamination, such as a local oscillator or other clock source. As specific examples, the signal source 102 could represent a PLL synthesizer, a frequency locked loop (FLL) synthesizer, or an uncontrolled and continuous-tuned oscillator. Any signal source 102 that provides an unmodulated source signal or a source signal having no intentional angle modulation could be used. In other cases, the source 102 could have intentional modulation but with the desire to remove it. The source signal from the signal source 102 could also have any suitable frequency or frequency range, such as any frequency or frequency range between 100 MHz and 3 GHz (like 1.5 GHz to 1.6 GHz). In particular embodiments, the signal source 102 represents a 1,500 MHz PLL synthesizer with an internal "divide by six" that outputs a 250 MHz source signal.

A splitter 104 splits the source signal from the signal source 102 into two equal replicas for delivery to different processing paths. The signal components output by the splitter 104 can be substantially or completely in phase with one another. The splitter 104 includes any suitable structure for splitting an input signal, such as an RF power splitter.

One output component of the splitter 104 is provided to a phase demodulator/amplifier/inverter 106, and another output component of the splitter 104 is provided to a phase modulator 108. The demodulator/amplifier/inverter 106 generally operates to demodulate phase noise and other contaminating sidebands from the source signal to baseband as if they were desired signals. The demodulator/amplifier/inverter 106 can then amplify and invert the baseband signal and provide the amplified inverted signal to the phase modulator 108. The demodulator/amplifier/inverter 106 includes any suitable structure for demodulating, amplifying, and inverting a signal that has previously angle modulated a carrier, such as a phase demodulator. Note that while a single functional block is shown here, the demodulator/amplifier/inverter 106 could be implemented using any number of separate functional units. Also note that inversion of the baseband signal indicates that the phase difference between the baseband signal and the modulation contained within the signal source passing through the modulator 108 at the same time is substantially or completely 180° out of phase.

Referring to the phase modulator 108, its carrier input receives the source signal from the splitter 104, and its modulation input receives the demodulated and inverted baseband signal from the demodulator/amplifier/inverter 106. The phase modulator 108 then phase modulates the source signal using the demodulated and inverted baseband signal from the demodulator/amplifier/inverter 106 to remove the source signal's phase modulation contamination. The output of the phase modulator 108 is therefore the source signal with reduced phase noise, period jitter, and other contamination. The phase modulator 108 includes any suitable structure for phase modulating a signal.

As noted above, using this approach can substantially reduce phase noise, period jitter, and other contamination in the signal output by the phase modulator 108 compared to the original source signal from the signal source 102. This type of approach can find use in a wide variety of fields, and reduced phase noise or period jitter allows this approach to be used in applications where prior approaches could not. Consider, for example, multi-carrier Global System for Mobile communications (GSM) systems. GSM service providers (as is likely true for most if not all other wireless service providers) can support a modified band plan to accommodate an increased number of subscribers per cell if the phase noise or period jitter of transmitter and receiver local oscillator sources is reduced. Ordinarily, a transmitter produces phase noise energy in adjacent channels that raises the overall noise floor, and a receiver suffers from a mechanism called "reciprocal mixing" that produces the same adjacent channel effect, which effectively increases the system noise figure. The techniques described in this document can reduce the phase contamination in transmitters and receivers, enabling an increased number of subscribers per cell. In particular embodiments, this approach could allow a GSM carrier operating at 900 MHz to achieve −146 dBc/Hz at 800 kHz away from the carrier frequency. As the techniques described in this document reduce the levels of any angle-modulated components, many types of monochromatic signal source generators that produce deterministic spurious components, such as direct digital synthesis ("DDS"), ordinary phase locked loop, multiple modulus pre-scaling, fractional N, and Sigma-Delta synthesizers, can benefit from its application.

Figure 2:
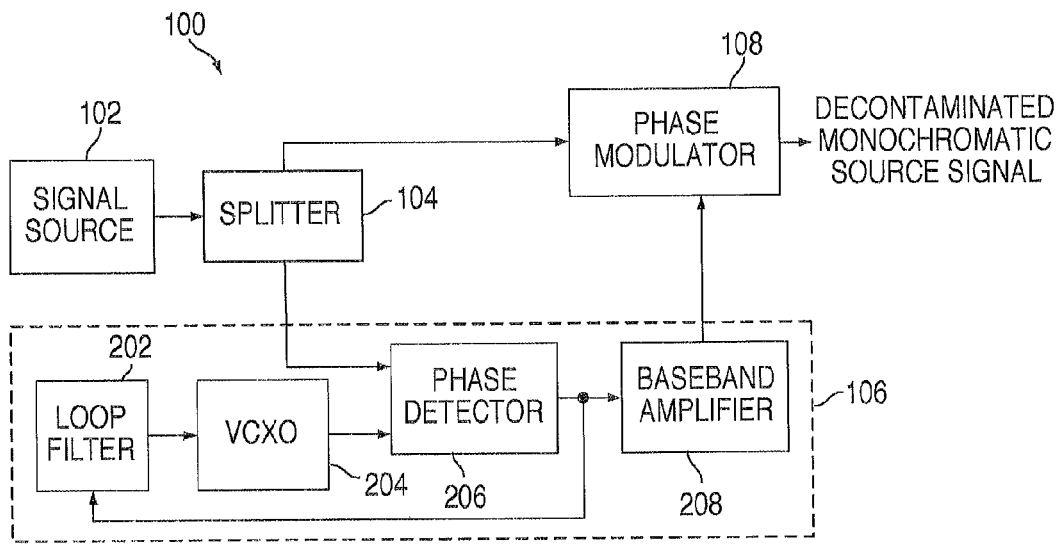

FIG. 2 illustrates an example phase noise demodulator/amplifier/inverter 106 from the system 100 of FIG. 1. In this example that specifically demonstrates the soundness of the amplification, baseband inverter, and phase modulation process, the demodulator/amplifier/inverter 106 includes a loop filter 202, a voltage-controlled crystal oscillator (VCXO) 204, a phase detector 206, and a baseband amplifier 208.

The loop filter 202 filters the output of the phase detector 206 and generates an output that controls the crystal oscillator 204 to have the same average frequency as that of the signal from the splitter 104 and a phase difference that averages 90°. The phase detector 206 provides what is essentially the arithmetic product of its input signals to its output voltage, which averages 0V. The combined phase modulation on the signals from the splitter 104 and the crystal oscillator 204 appears at the phase detector's output as an AC baseband signal. Inasmuch as the crystal oscillator 204 has very low phase noise and other phase modulation compared with the signal from the splitter 104, the AC signal at the output of the phase detector 206 is the demodulated waveform of all energy that is angle-modulating the signal from the splitter 104. The crystal oscillator 204 could also include additional functionality, such as a frequency doubler, to equalize the frequency with the signal from the splitter 104. The phase detector 206 compares the phases of the signals from the crystal oscillator 204 and the signal source 102. The baseband amplifier 208 amplifies the output of the phase detector 206 and provides the amplified and inverted signal to the phase modulator 108.

The loop filter 202 includes any suitable structure for filtering a signal, such as a low-pass filter and/or a servo integrator. The crystal oscillator 204 includes any suitable oscillator for generating a monochromatic signal having far less phase noise and spurious contamination than the signal from splitter 104. The phase detector includes any suitable structure for comparing the phases of multiple input signals. The baseband amplifier 208 includes any suitable structure for amplifying a baseband signal.

The loop filter 202, crystal oscillator 204, and phase detector 206 operate to identify the phase contamination in the source signal from the source 102. That contamination is output by the phase detector 206 as a baseband signal, effectively demodulating the phase noise and other contamination. The baseband signal is then amplified by the amplifier 208 and provided to the phase modulator 108, which modulates the source signal from the source 102 using the amplified and inverted baseband signal. The output of the phase modulator 108 is the source signal with reduced phase contamination.

Figure 3A:
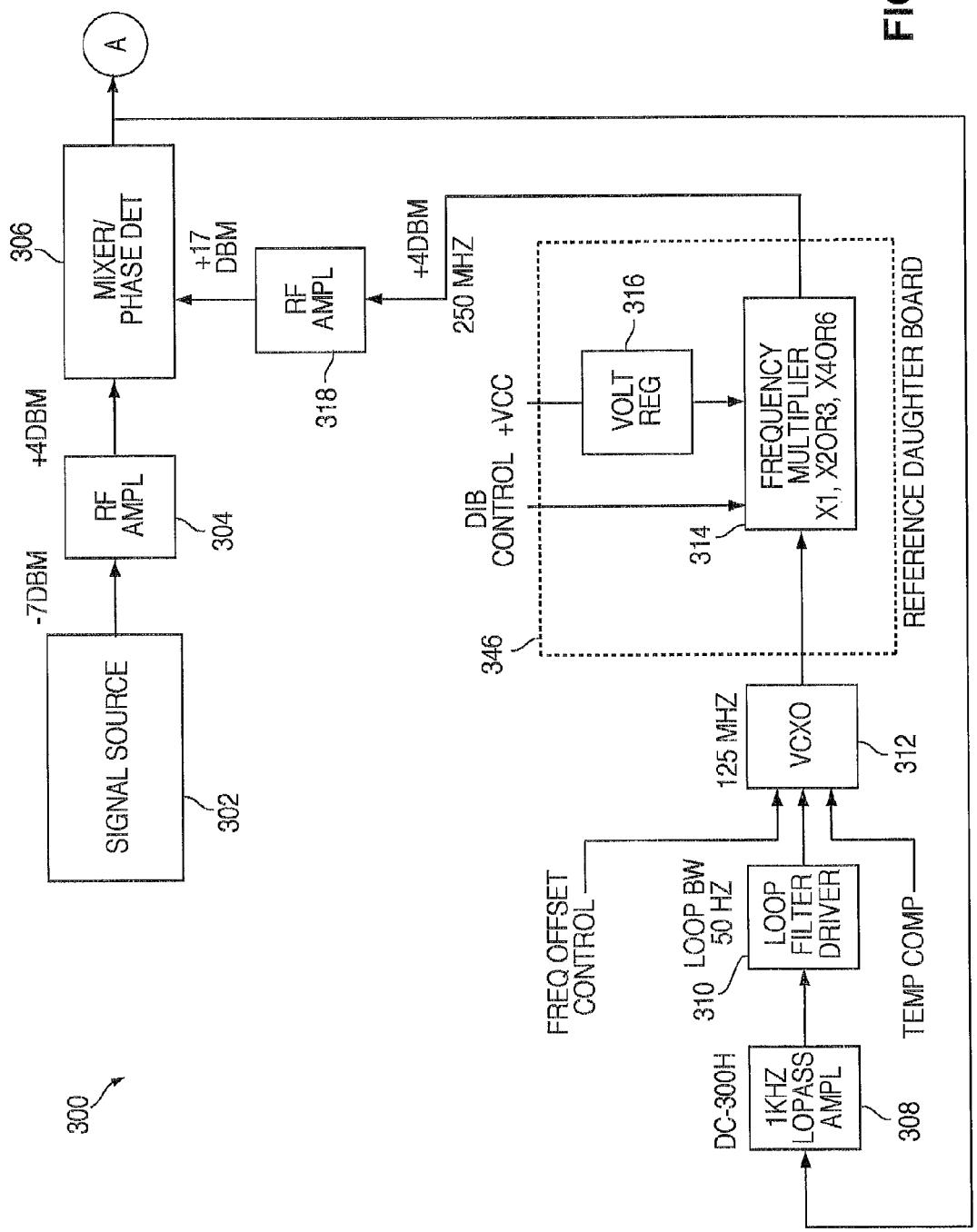
Figure 3B:
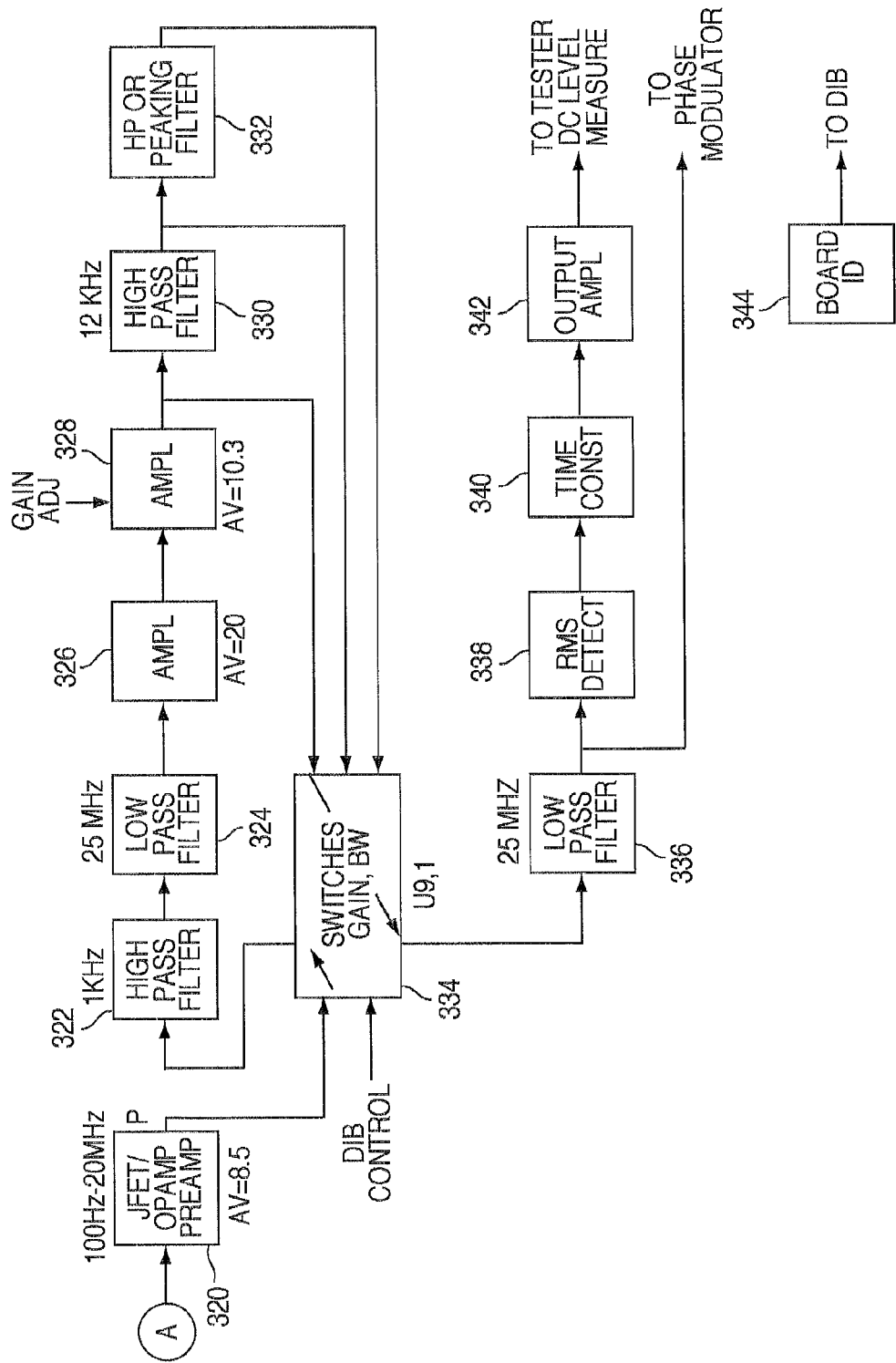

FIGS. 3A and 3B illustrate another example system 300 for performing signal cancellation to reduce phase contamination of a signal. As shown in FIG. 3A, the system 300 includes a signal source 302, such as a PLL synthesizer. A source signal from the source 302 is provided to an amplifier 304, which amplifies the source signal. The amplifier 304 represents any suitable structure for amplifying a signal, such as an RF amplifier. The amplified source signal is provided to a mixer/phase detector 306, which mixes the amplified source signal with a feedback signal and/or compares the phases of the amplified source signal and the feedback signal. The mixer/phase detector 306 includes any suitable structure for mixing or comparing signals.

An output of the mixer/phase detector 306 is provided to a low-pass amplifier 308. The low-pass amplifier 308 includes any suitable structure for amplifying a low-frequency portion of a signal, such as a 1 kHz low-pass amplifier that outputs a DC-300 Hz signal. The amplified signal is provided to a loop filter driver 310. The loop filter driver 310 includes any suitable structure for driving a crystal oscillator 312, such as a filter having a bandwidth of 50 Hz. An output of the loop filter driver 310 is provided to the crystal oscillator 312, which represents any suitable oscillator, such as a 125 MHz voltage controlled crystal oscillator. The crystal oscillator 312 operates using the output of the loop filter driver 310 and can also operate using a frequency offset control signal and/or a temperature compensation control signal.

The monochromatic signal from the crystal oscillator 312 is provided to a frequency multiplier 314, which can multiply the frequency of the monochromatic signal by an integral amount. The frequency multiplier 314 includes any suitable structure for increasing a signal's frequency, and in this example the frequency multiplier 314 can multiply the frequency of the monochromatic signal by a value from one to six. The frequency multiplier 314 receives a device interface board (DIB) control signal and an input voltage from a voltage regulator 316. In this particular example, the frequency multiplier 314 outputs a frequency-multiplied noise-free feedback signal between 125 MHz and 750 MHz, such as 250 MHz. The frequency-multiplied feedback signal is amplified by an amplifier 318, such as an RF amplifier, before being provided to the mixer/phase detector 306 as the feedback signal.

As shown in FIG. 3B, the output of the mixer/phase detector 306 is provided to an amplifier 320, such as a 100 Hz-20 MHz amplifier with a gain of 8.5. The amplifier 320 includes any suitable amplification structure, such as a junction gate field effect transistor (JFET) amplifier or preamplifier. An amplified output of the amplifier 320 is provided via one or more switches in a switch bank 334 to a high-pass filter 322, such as a 1 kHz high-pass filter. An output of the filter 322 is provided to a low-pass filter 324, such as a 25 MHz filter.

An output of the filter 324 is provided to a first amplifier 326 and then to a second amplifier 328. The amplifiers 326-328 could have gains of 20 and 10.3, respectively, and the second amplifier 328 can operate using a gain adjust control signal. An output of the amplifier 328 is provided to a high-pass filter 330 (such as a 12 kHz filter) and then to a high-pass or peaking filter 332.

An output of the filter 332 is provided via one or more switches in the switch bank 334 to a low-pass filter 336, such as a 25 MHz filter. An output of the filter 336 can be provided to a Fast Fourier spectrum analyzer or to a phase modulator (such as the phase modulator 108). Here, the output of the filter 336 can also be provided to a root mean square (RMS) detector 338 to help quantify the phase noise and contaminant level, which provides an output to a time constant-providing circuit 340 whose output is amplified by an amplifier 342. A board identification unit 344 provides a circuit board identifier as output.

In FIGS. 3A and 3B, phase noise sidebands are again demodulated to baseband, and the baseband signal is amplified and output to a phase modulator 108. The phase modulator 108 can then use the amplified baseband signal to reduce phase noise, period jitter, or other contamination in the signal from the source 302.

Note that in this embodiment, the system 300 is implemented using a phase noise/jitter measuring instrument such as those described in U.S. Pat. No. 7,809,517 (which is hereby incorporated by reference). In this embodiment, various components 314-316 are implemented on a daughter board 346 that can be inserted into or otherwise coupled to the measuring instrument. Of course, various components in FIGS. 3A and 3B could be omitted (such as components 338-344) if different measuring instruments or other devices are used to implement this technique.

In particular embodiments, the same type of RF amplifier can be used for the amplifiers 304 and 318, such as those that provide 6 dB more baseband signal and a 6 dB lower noise floor. Also, the amplifier 320 can be implemented using a JFET pre-amplifier to provide a lower noise figure and a flatter baseband response. Further, a test program-selectable frequency multiplication factor can be used in the daughter board 346 as the control signal for the frequency multiplier 314. In addition, one or more additional baseband filters can be used for customer flexibility. When used for cancellation of phase noise and other contamination, the various baseband filters 322, 324, 330 determine the offset frequency band over which the cancellation occurs.

Figure 4:
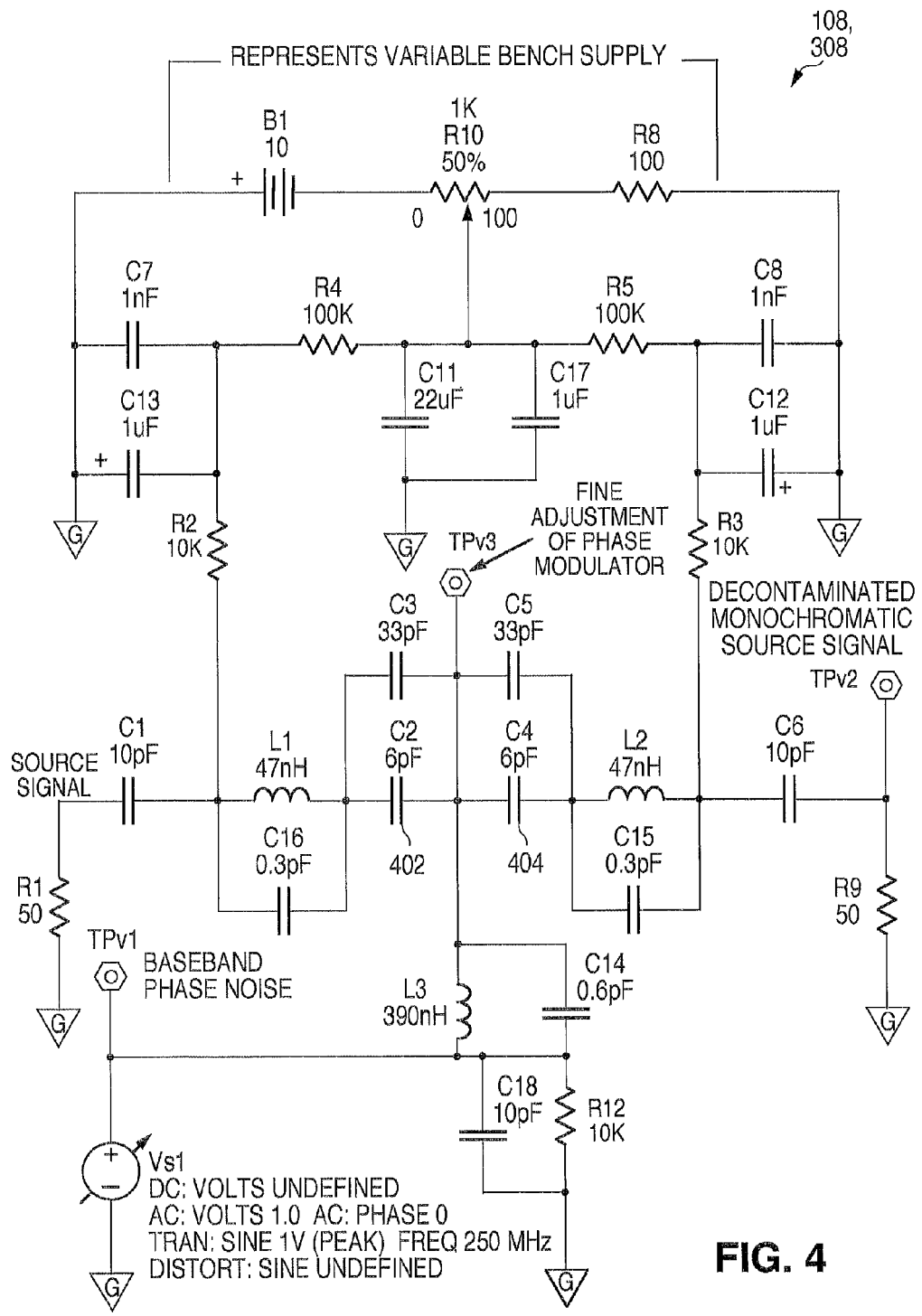

FIG. 4 illustrates an example ("reactance") phase modulator 108, 308 from the system 100, 300. In this example, the phase modulator 108, 308 is formed using various capacitors, resistors, and inductors, as well as a variable voltage source. A source signal from the source 102, 302 is received at the middle left of the phase modulator, and the demodulated and inverted phase noise and other contamination are received at the lower left of the phase modulator. The source signal with reduced contamination is provided by the phase modulator at the middle right of the phase modulator. In particular embodiments, two capacitors 402-404 could be implemented using MMBV2101 varactor diodes.

The approach illustrated in FIGS. 1 through 4 for reducing phase contamination using phase detection can be used with various devices. This includes synthesizers that are designed for very narrow channel spacing rather than low phase noise, but low phase noise is achieved nevertheless. Phase noise, deterministic spectral components, and other contamination can be reduced regardless of whether the original source 102, 302 is inside or outside the bandwidth of the signal source's PLL loop.

FIGS. 5 through 11 illustrate example systems for performing signal cancellation to reduce phase contamination of a signal using frequency detection and related details according to this disclosure. These embodiments may omit a crystal oscillator, other ultra-clean oscillator, and/or a resonator needing to be on the signal source's present operating frequency from their design.

Figure 5:
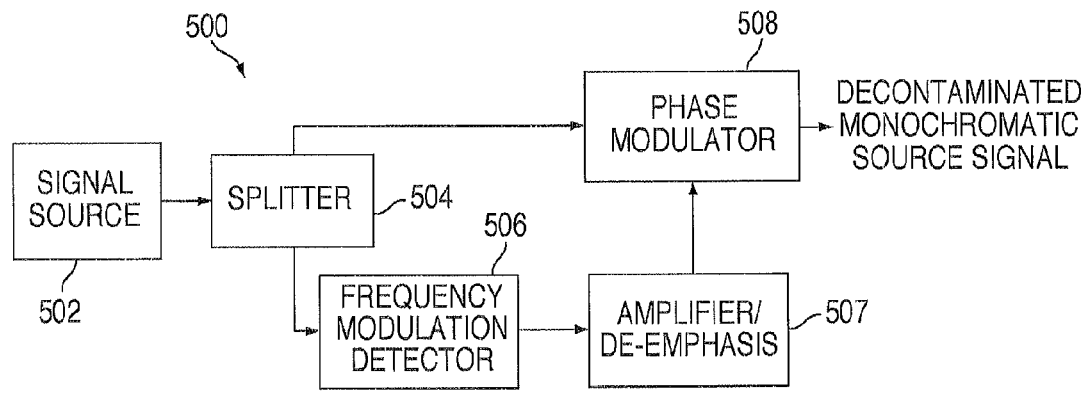
FIGS. 5 through 11 illustrate example systems for performing signal cancellation to reduce phase contamination of a signal using frequency detection and related details according to this disclosure.

As shown in FIG. 5, a system 500 includes a signal source 502, such as a PLL synthesizer, DDS synthesizer, FLL synthesizer, or uncontrolled and continuous-tuned oscillator. In particular embodiments, the signal source 502 outputs a source signal between 100 MHz and 5 GHz. The source signal from the source 502 is split using a splitter 504.

One output component of the splitter 504 is provided to a frequency modulation (FM) detector 506 which detects frequency modulation in the signal from the source 502. As the signal source 502 increments its output frequency, this causes the FM detector 506 to move along its detector curve. This allows the detector 506 to demodulate phase noise sidebands without the use of a reference oscillator. This approach therefore eliminates the need for a crystal oscillator, other ultra-clean oscillator, and/or a resonator needing to be on the signal source's present operating frequency. This approach also can support multiple channels, even those that are very closely spaced, such as those provided by sources 502 that normally suffer from relatively high phase noise and other degradations. Another advantage of FM detectors is that they can have more inherent sensitivity to high modulating frequency phase modulation. This is because the amount of frequency deviation for a given amplitude of phase modulation is directly proportional to the modulating frequency. This is useful for demodulating phase noise, which almost always falls off rapidly with offset frequency.

The FM detector 506 includes any suitable structure for detecting frequency modulation, including but not limited to a slope detector, a delay line discriminator, a quadrature detector, a Foster Seeley detector, or a ratio detector. In some embodiments, the FM detector 506 includes a broadband detector, allowing phase noise reduction of a drifting self-controlled oscillator (source 502). However, any suitable FM detector with adequate frequency-to-voltage conversion gain can be used. A slope detector can use the transition slope of any suitable filter, such as an elliptic filter, a band-pass filter, or any other suitable structure. An asynchronous envelope detector, such as an "infinite Z" detector, can respond only to the AM analog of the phase noise and other angle-modulated energy created by the amplitude response transition, not to the angle modulation still present.

The output of the FM detector 506 is fed to an amplifier/de-emphasis equalizer 507. The amplifier/equalizer 507 amplifies the output of the detector 506 and performs de-emphasis operations, such as by using a low pass filter with a 6 dB/octave response, to cause the baseband signal voltage to be proportional to instantaneous phase offset over the applicable baseband spectrum, as if a phase detector rather than a frequency detector had been used. The amplifier/equalizer 507 also attenuates system noise. The output of the amplifier/equalizer 507 represents phase noise at baseband, which can be fed to a phase modulator 508 along with another output component of the splitter 504 for use in modulating the source signal to help remove phase contamination. The amplifier/equalizer 507 includes any suitable structure for amplifying and de-emphasizing an FM signal.

Figure 6A:
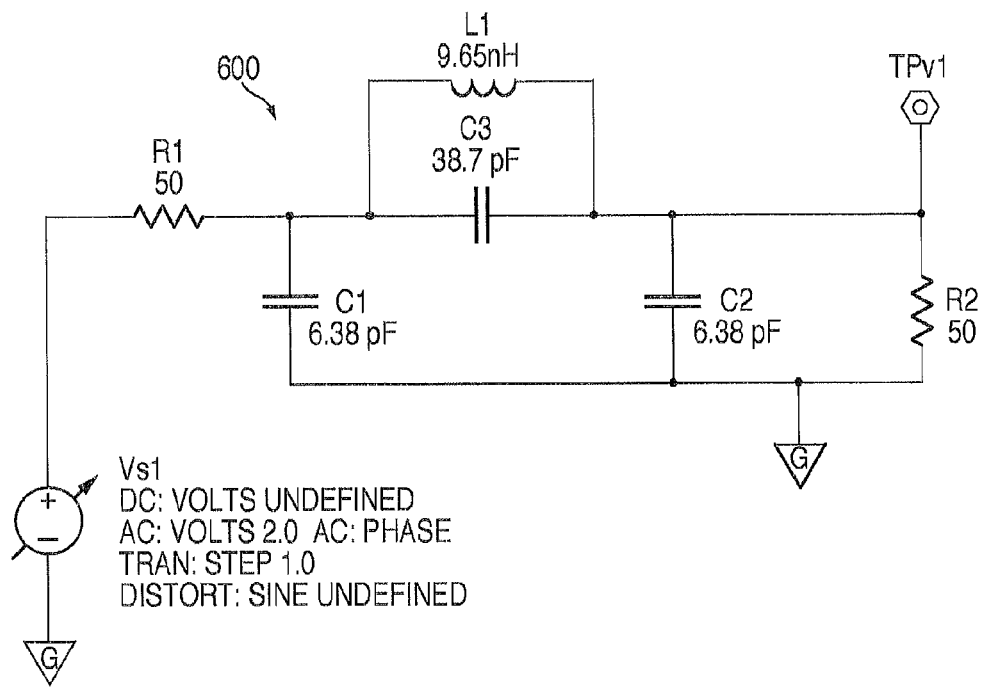
Figure 6B:
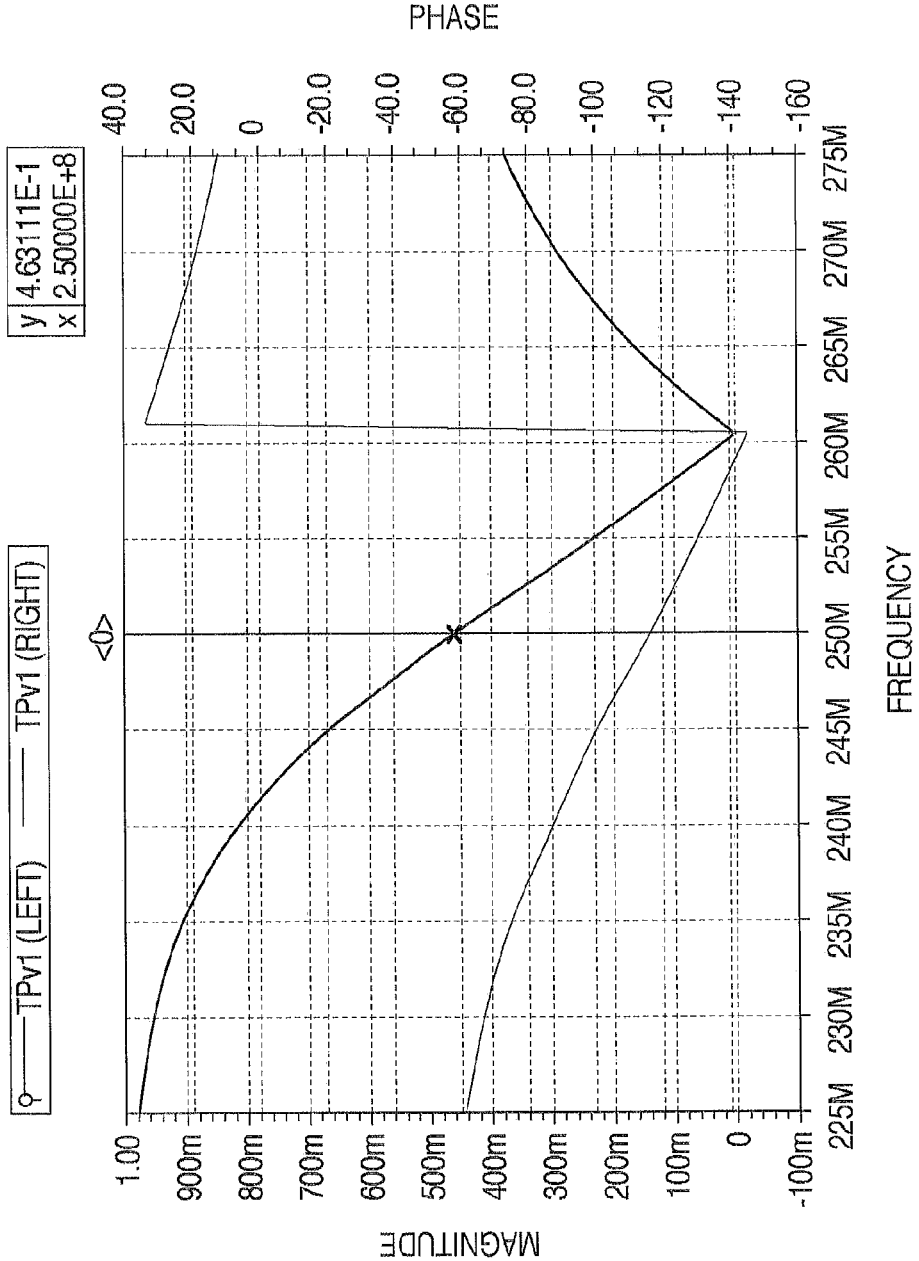

FIGS. 6A and 6B illustrate an example implementation of part of an FM slope detector 600, which could be used along with an AM detector as the FM detector 506 in FIG. 5. As shown in FIG. 6A, the detector 600 is implemented using a low-pass filter, whose transition band causes a signal that was frequency modulated to also be amplitude modulated. The detector 600 here includes various capacitors, resistors, and an inductor, as well as an AC voltage source that represents the signal source 502. The frequency response of the low-pass filter is shown in FIG. 6B. Ideally, the transition band response curve has a constant slope and constant time delay. However, the phase noise and other contamination being demodulated can have such a low level that these two requirements are not critical.

Figure 7A:
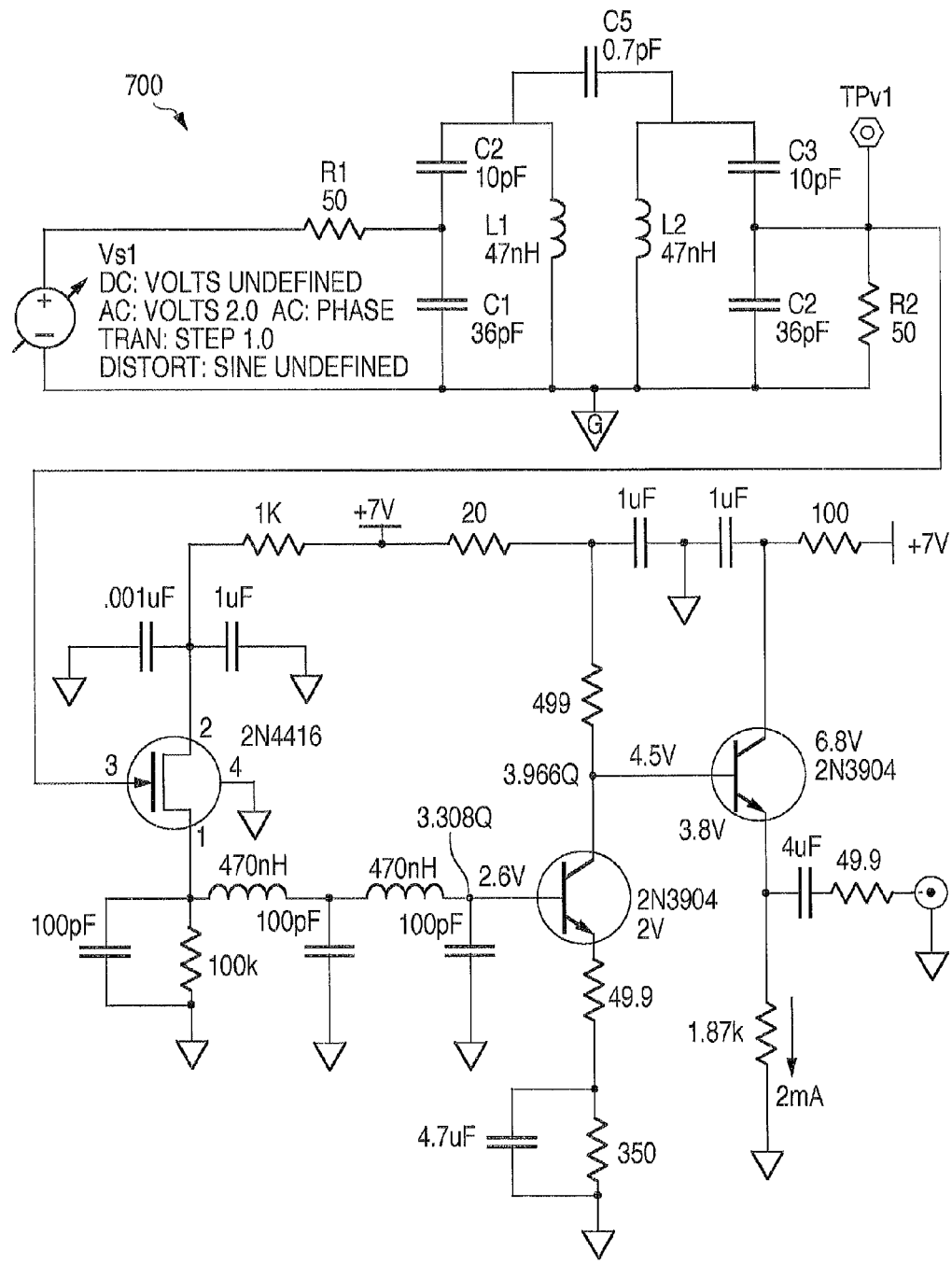
Figure 7B:
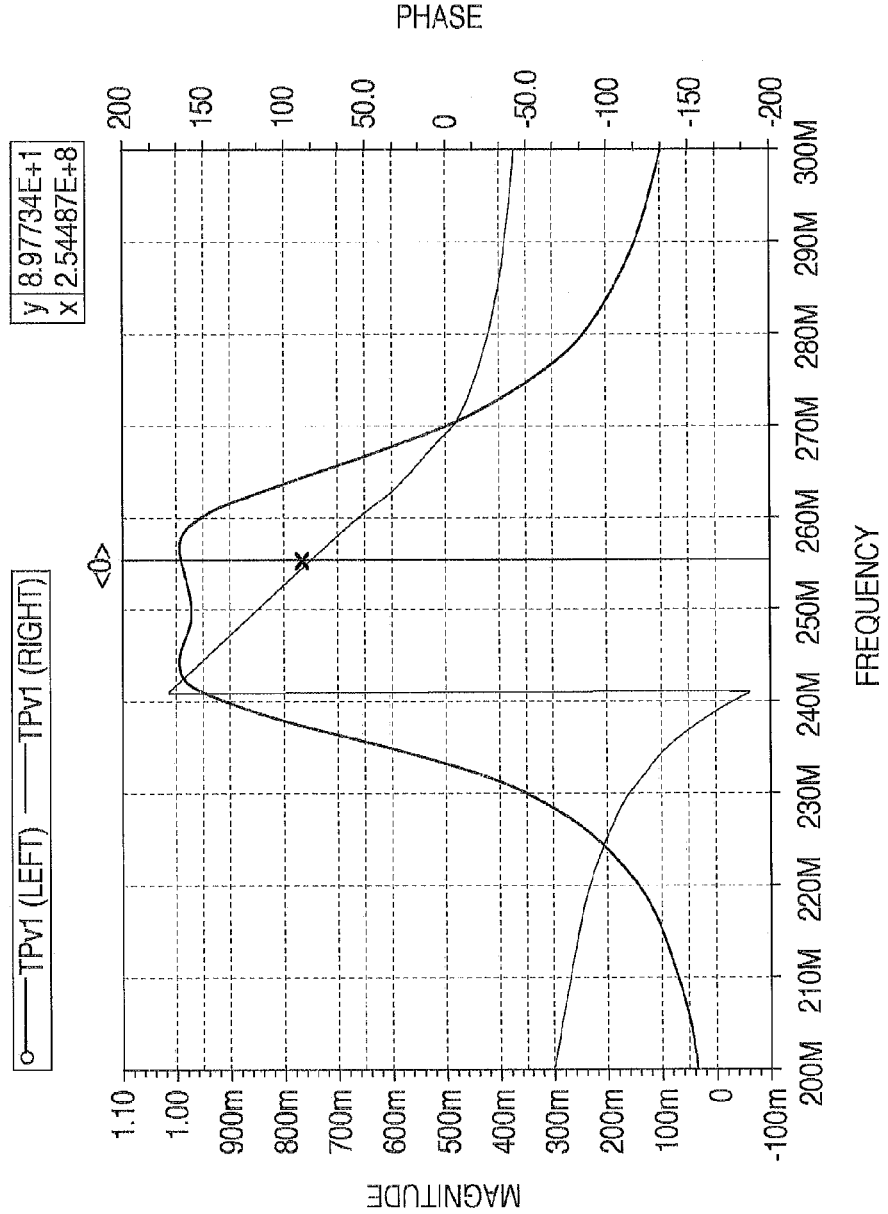

FIGS. 7A and 7B illustrate an example implementation of a complete FM slope detector 700, which could be used as the FM detector 506 in FIG. 5. As shown in FIG. 7A, the detector 700 is implemented using a band-pass filter, complete with a detector used as the AM envelope detector. The detector 700 here includes various capacitors, resistors, inductors, and transistors, as well as an AC voltage source that represents the signal source 502. The frequency response of the band-pass filter is shown in FIG. 7B.

In this example, following the band-pass filter (which can be adjusted to place a signal on either stop-band selectivity transition slope) is an "infinite impedance" type envelope (AM) demodulator. Other types of envelope detectors could also be used. At the input of the demodulator, the carrier signal level could be about 1V RMS. Following the demodulator is a low-pass filter to remove RF components and a low noise preamplifier that covers the relevant frequency range of the demodulated phase noise (such as from 1 kHz to 1 MHz). Following that is the amplifier/de-emphasis equalizer 507 and the phase modulator 508, which are not shown in FIGS. 7A and 7B. If a frequency modulator is used in place of the phase modulator 508, the de-emphasis network may not be required.

In particular embodiments, for a 4V peak-to-peak input, this FM detector's output can change by 300 mV over 6 MHz with a conversion factor of 50 nV/Hz. Total noise deviation of the signal source (in the 1 kHz to 10 MHz sidebands) at 250 MHz can be about 430 Hz RMS. Therefore, the noise voltage from this detector is about 21.5 µVRMS. At a 50Ω impedance level, this is about −80 dBm or 20 dB above the thermal noise for a 3 dB noise figure, which is suitable for measuring phase noise. Moreover, a carrier amplitude modulation can result in a 3 dB signal-to-noise (S/N) reduction. In addition, detected noise voltage can ride on a large carrier remnant, which can be filtered out. This could be used with a synchronous AM detector that handles arbitrarily weak signals and that uses a double balanced mixer, but there may be complications caused by the remaining angle modulation following a slope detector frequency versus amplitude network.

Figure 8:
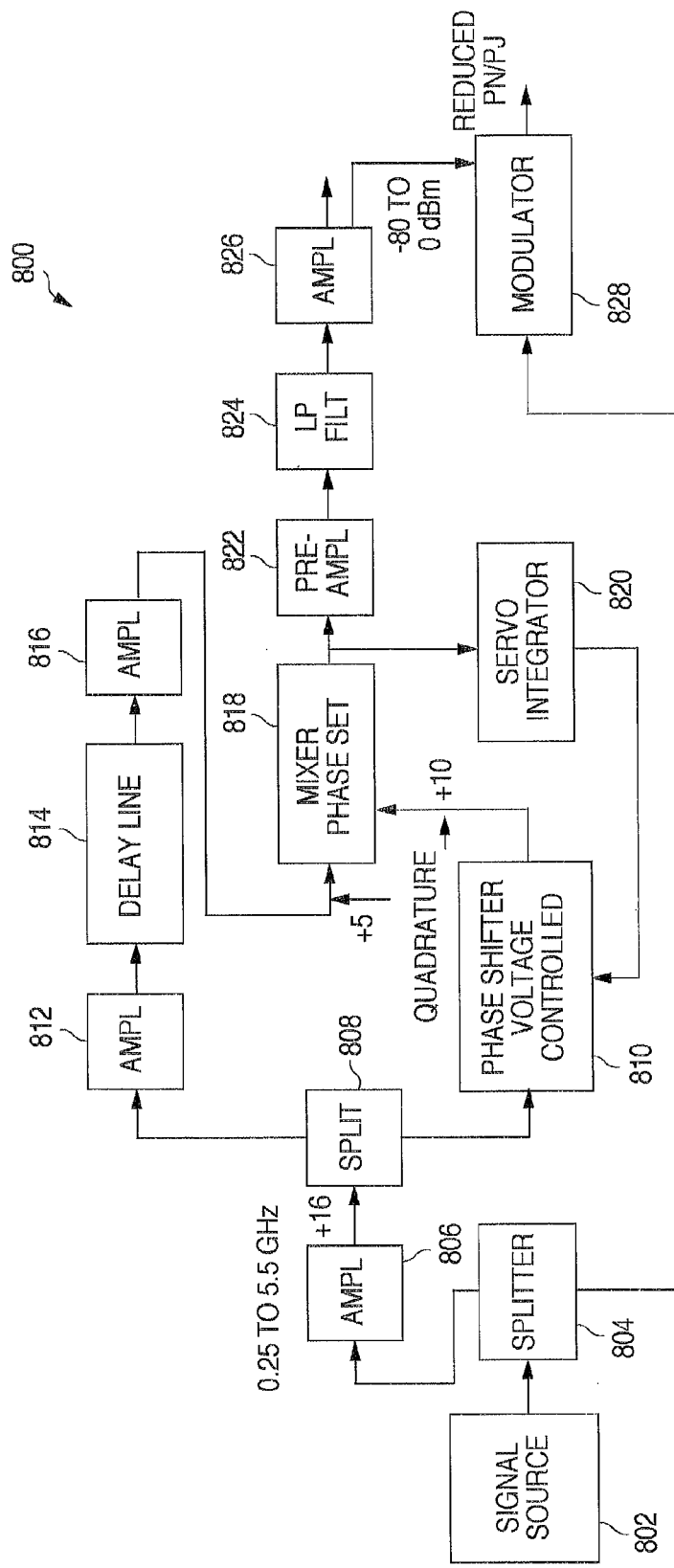

FIG. 8 illustrates another example system 800 that uses a delay line discriminator type FM demodulator for performing signal cancellation to reduce phase contamination of a signal. In this example, the system 800 includes a signal source 802 and a splitter 804. One output component of the splitter 804 is provided to an amplifier 806, which could represent an RF amplifier that operates between 0.25 GHz and 5.5 GHz.

The amplified signal is provided to another splitter 808, which splits the amplified signal between a phase shifter 810 and an amplifier 812. The phase shifter 810 can shift its input signal to help create quadrature components in the system 800. The phase shifter 810 includes any suitable structure for shifting the phase of an input signal, such as a voltage-controlled phase shifter. The amplifier 812 amplifies its input signal and provides the amplified signal to a delay line 814, which delays the input signal by a specified amount of time (such as 50 ns to 500 ns). The delay line 814 includes any suitable structure for delaying an electrical signal by a desired amount. The delayed signal is provided to another amplifier 816, which amplifies the delayed signal.

The outputs of the amplifier 816 and the phase shifter 810 are provided to a mixer/phase detector 818, which mixes the signals and/or compares the phases of the signals. An output of the mixer/phase detector 818 is provided to a servo integrator 820, which adjusts the phase shifter 810 so that the inputs to the mixer/phase detector 818 generally remain in quadrature. A particular example mixer/phase detector 818 may have a transfer characteristic such that when its output is at 0V, the phase difference between the signals at its inputs is 90°. In this case, the servo integrator 820 has a 0V reference. The output of the mixer/phase detector 818 is also provided to a pre-amplifier 822, a low-pass filter 824, and an amplifier 826 before being provided to a modulator 828. The servo integrator's time constant is long enough so that the lowest relevant frequency spectral components of the phase noise and other contamination are not removed by the loop and therefore appear at this baseband preamplifier. The components 810, 818, and 820 form a true phase locked loop, as only phase is being adjusted and not frequency.

This architecture uses the delay line 814 and requires no local oscillator or phase/frequency locking, which may be useful or ideal for drifting sources 802. How rapidly the source 802 can drift in frequency and maintain proper operation of the system is determined in part by the servo integrator's time constant, which is fast enough to maintain adjustment of the phase shifter 810. In particular embodiments, a possible useful range of sideband frequencies can be 1000:1. For use ranging from 5 kHz to 5 MHz sidebands, a delay of 50 ns could be used in the delay line 814. Note that a 50 ns delay line implemented with a printed circuit board trace could have a large loss at 2 GHz unless a suitable dielectric is used. As a particular example, a low-loss delay line 814 could be 17 in$^2$ in size, which is suitable for use in equipment like base stations, as opposed to ultra-miniature hand-held equipment. A 50 ns delay line 814 may be suitable down to 5 kHz sidebands, and a 500 ns delay line 814 may be suitable for 500 Hz sidebands. This could be very practical and effective for high sideband frequencies (such as 500 kHz-20 MHz or more). At a 500 kHz offset frequency, the delay may need to be only 0.5 ns, for which only a 5 inch-long delay line or a practical lumped component network may be used.

Figure 9:
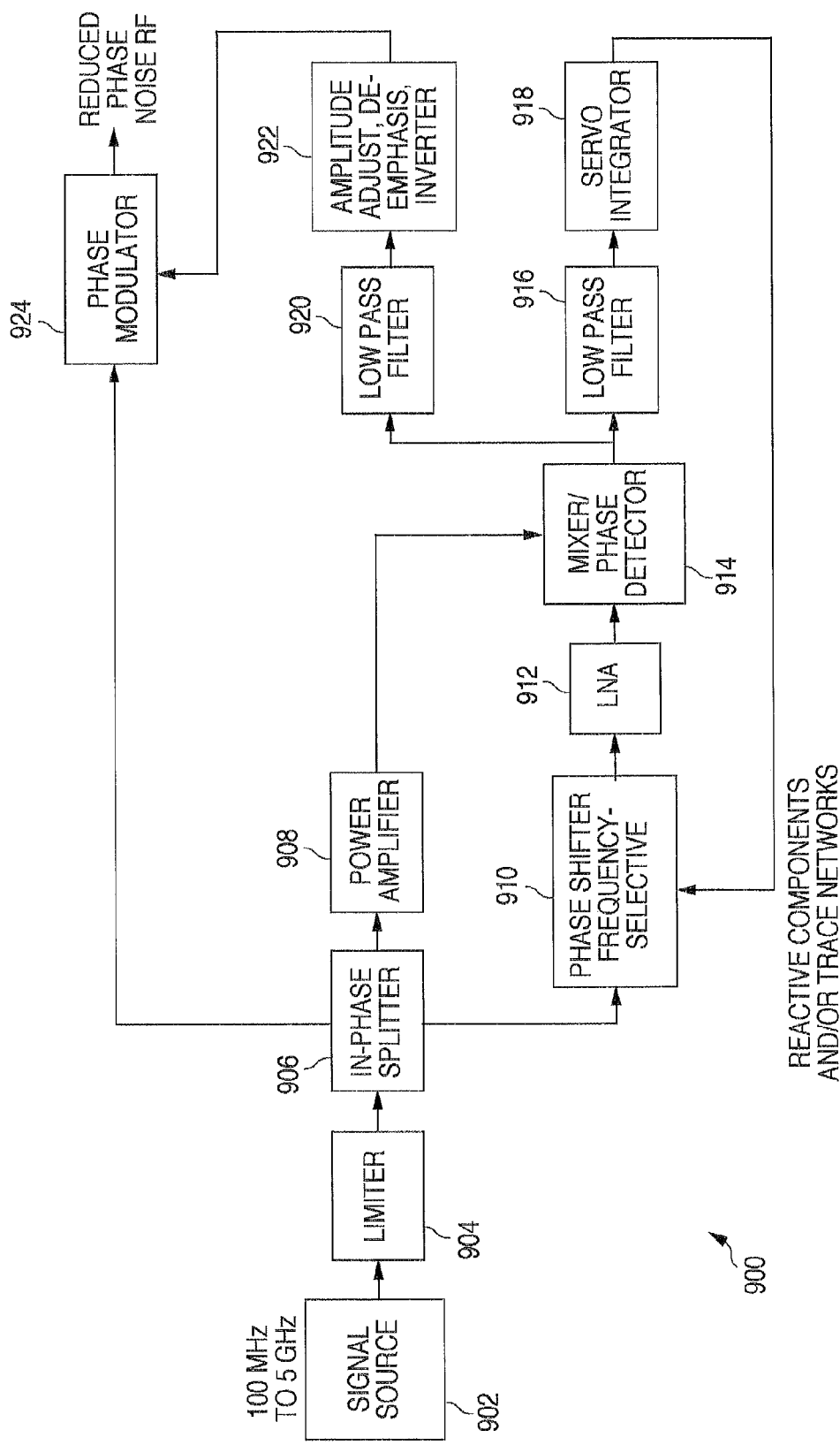

FIG. 9 illustrates an example system 900 for performing signal cancellation to reduce phase contamination of a signal using a quadrature FM detector. In this example, a signal source 902 (such as a 100 MHz to 5 GHZ source) provides a source signal to a limiter 904, which removes amplitude noise and other AM contamination from the source signal. An in-phase splitter 906 divides the signal and provides portions of the signal to a power amplifier 908 and a frequency-selective phase shifter 910. In particular embodiments, the phase shifter 910 could be implemented using reactive components or a trace network. A low-noise amplifier 912 amplifies an output of the phase shifter 910. The amplified outputs of the amplifiers 908 and 912 are provided to a mixer/phase detector 914, which mixes the signals and/or compares the phases of the signals.

An output of the mixer/phase detector 914 is filtered by a low-pass filter 916, and the filtered output is provided to a servo integrator 918. In particular embodiments, the servo integrator 918 can represent a slow integrator referenced to 0V that adjusts the phase shifter 910 to maintain an average phase difference of 90° between the phase detector's inputs as the carrier frequency from the source 902 varies with channel setting. The phase shifter 910 can be designed to vary its phase shift with frequency. As higher-speed phase noise, other angle-modulated noise, and/or non-stochastic spurious components from the signal source 902 and the splitter 906 cause instantaneous frequency excursions, the instantaneous phase value across the phase detector's inputs differs from 90°. The phase detector 914 registers these phase differences as voltage differences at its output. This voltage waveform is the analog version of all angle-modulated energy on the carrier, and it propagates through a higher-cutoff frequency filter 920 and then through circuitry 922, which can include amplitude adjustment, de-emphasis, and inversion circuitry. The output of the circuitry 922 can be used to drive a phase modulator 924. In this example, the system 900 is similar to the system 800 (which uses a delay line demodulator), but there is no delay line, and the phase shifter 910 needs to be frequency-selective, meaning its phase shift needs to be a strong function of frequency.

In particular embodiments using a quadrature FM detector as is done in FIG. 9, a quadrature FM receiver integrated circuit with a single parallel-tuned circuit phase shifter can deliver 3.6 mV per kHz deviation with a 10.7 MHz carrier. The output signal-to-noise ratio can be 75 dB below 162 mV RMS with a 15 kHz bandwidth-system noise floor of 28.8 µV or a 10 MHz bandwidth-system noise floor of 744 µV. Note that the phase shift network can be designed so that the total average shift is substantially 90° and the network with the highest possible slope (phase shift/frequency) over the very narrow phase noise deviation. In particular embodiments, two network stages could be used, one to maintain 90° and another with a high slope region centered on 0°.

Figure 10:
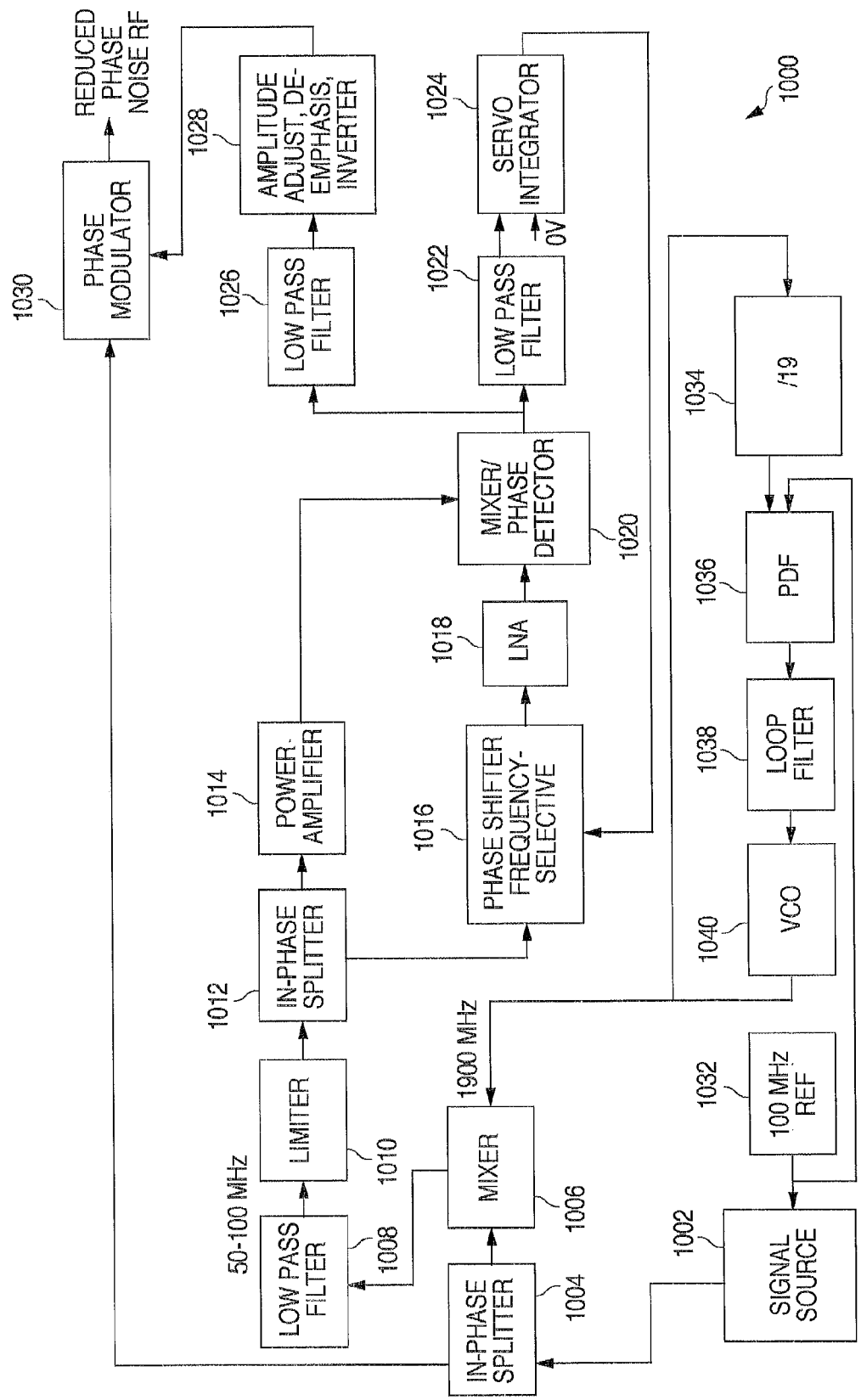

FIG. 10 illustrates an example system 1000 for performing signal cancellation to reduce phase contamination of a signal using a low phase noise local oscillator in a down-conversion subsystem to operate an FM detector at low frequency (where it is more likely to have a larger conversion gain). As shown in FIG. 10, a signal source 1002 provides a source signal to an in-phase splitter 1004. The signal source 1002 could, for example, represent a high phase noise PLL synthesizer that operates between 1,950 MHz to 2,000 MHz in 1 kHz steps. The splitter 1004 divides the source signal and provides a portion of the source signal to a heterodyne mixer 1006, which mixes the source signal with a low noise local oscillator signal to down-convert the source signal. The frequency-converted signal is fed to a low-pass filter 1008, such as a 50-100 MHz filter, which removes the sum frequency component from the heterodyning process. A limiter 1010 removes amplitude noise and other AM contamination from the filtered signal, and an in-phase splitter 1012 divides the signal and provides portions of the signal to a power amplifier 1014 and a frequency-selective phase shifter 1016. A low-noise amplifier 1018 amplifies an output of the phase shifter 1016. The amplified outputs of the amplifiers 1014 and 1018 are provided to a mixer/phase detector 1020, which mixes the signals and/or compares the phases of the signals.

The output of the mixer/phase detector 1020 is filtered by a low-pass filter 1022, and the filtered output is provided to a servo integrator 1024. The servo integrator 1024 helps to maintain an average phase difference of 90° between the phase detector's inputs. The output of the mixer/phase detector 1020 is also provided to a higher-cutoff frequency filter 1026 and then to circuitry 1028, which can include amplitude adjustment, de-emphasis, and inversion circuitry. The output of the circuitry 1028 can be used to drive a phase modulator 1030.

In this example, an auxiliary PLL synthesizer is formed by a reference source 1032, a divider 1034, a phase frequency detector (PFD) 1036, a loop filter 1038, and a voltage controlled oscillator (VCO) 1040. The reference source 1032 could represent a 100 MHz source or other source that provides its output signal to the signal source 1002 and to one input of the phase frequency detector 1036. The other input of the phase frequency detector 1036 comes from the divider 1034, which could represent a "divide by 19" divider. The divider 1034 reduces the frequency of the output of the oscillator 1040 to equal that of the reference coming from the reference source 1032. The phase frequency detector 1036 compares the phases of its inputs, and the loop filter 1038 filters the output of the detector 1036 and generates a voltage for controlling the oscillator 1040. As the auxiliary PLL synthesizer has a small frequency divide ratio, it can have lower phase noise than an otherwise equivalent PLL synthesizer with a large frequency divide ratio. Moreover, in particular embodiments, the quadrature phase shifter 1016 can operate from 50 MHz to 100 MHz (where it can have adequate conversion gain), resulting in a 50,000-step synthesizer with phase noise similar to a low/N synthesizer. Note that this architecture can be used with any type of frequency/phase demodulator 1030.

Figure 11:
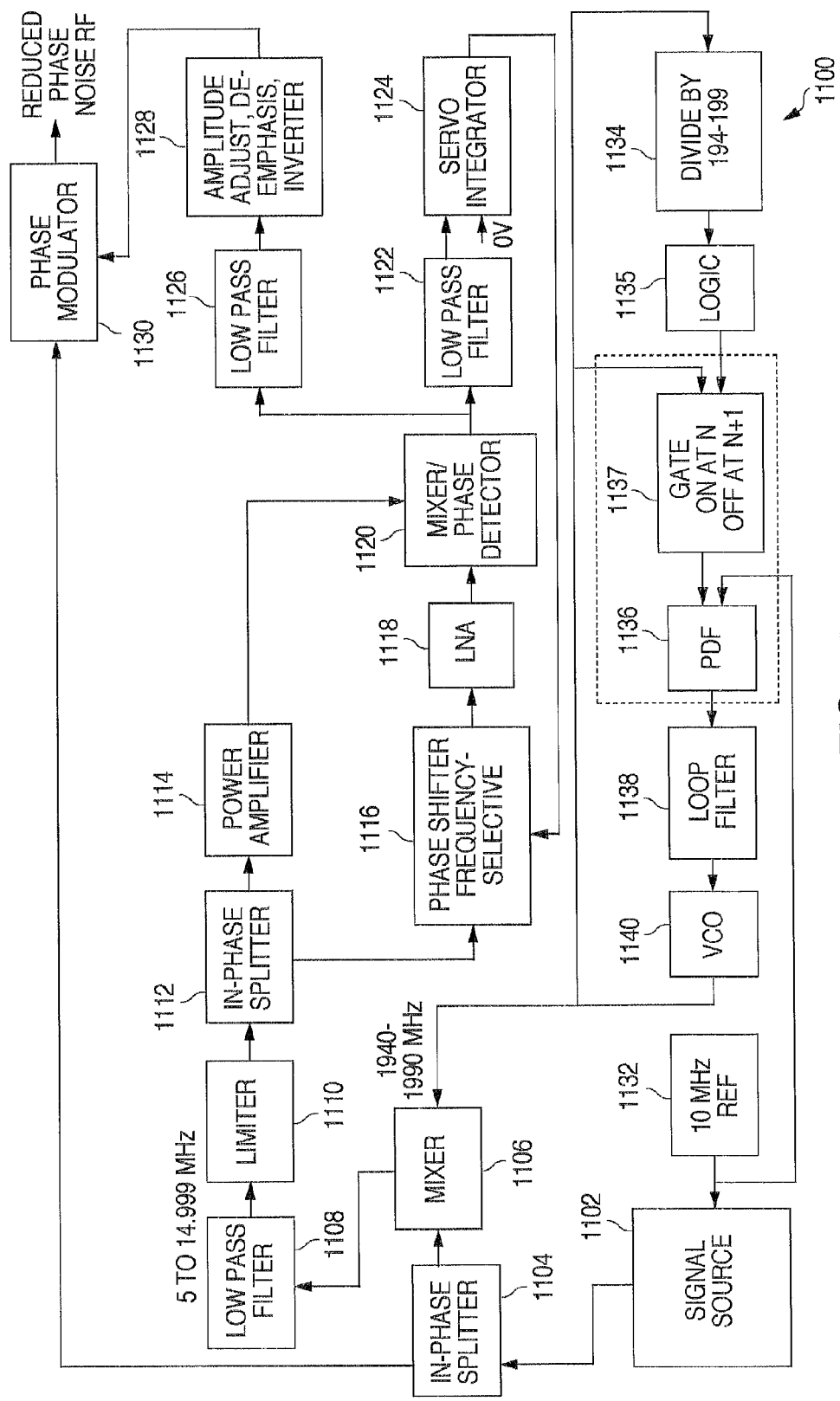

FIG. 11 illustrates an example system 1100 for performing signal cancellation to reduce phase contamination of a signal using an extremely low phase noise local oscillator signal in a down-conversion subsystem. This local oscillator includes an auxiliary phase locked loop synthesizer using an aperture phase detector. As shown in FIG. 11, the system 1100 includes components 1102-1130 that can be the same as or similar to corresponding components 1002-1030 in FIG. 10.

The auxiliary PLL synthesizer of the system 1100 includes a reference source 1132, such as a 10 MHz source, which could be the same as the one used for the signal source. A divider 1134, such as a "divide by 194-199" divider, divides a signal from a voltage-controlled oscillator 1140. A logic element 1135 and a gate 1137 are coupled between the divider 1134 and a phase frequency detector 1136, which has an output coupled to a loop filter 1138. The logic element 1135 repeatedly turns the gate 1137 on and off to provide the output of the oscillator 1140 to the detector 1136. The gate 1137 and the detector 1136 therefore form an aperture phase detector.

In a normal PLL synthesizer, a divider equalizes the VCO's frequency with that of the reference source so they can be compared for correction (as is done in FIG. 10). However, VCO phase variations are also divided, making them less distinguishable from system noise. The design in FIG. 11 uses the divider 1134 and the gate 1137 to feed VCO transitions with full phase variation directly to the phase/frequency detector 1136 once for each duty cycle of the reference frequency.

Not only does this aperture phase detector-type PLL synthesizer provide very low phase noise, it can do so with a higher divide ratio, thus permitting a fine enough frequency step resolution. As a result, after down-conversion from the mixer 1106, the frequency is much lower than for the architecture shown in FIG. 10. This lower frequency permits an FM demodulator such as shown in FIG. 11 (blocks 1112-1124) to operate with higher conversion gain. Another advantage of accurately heterodyning a signal source (such as source 1102) to a low frequency is that phase and frequency demodulation methods that might have too much absolute phase noise become adequate at low frequencies. Such demodulation methods, to adequately support the system architectures disclosed here, may need frequency agile LC (inductance-capacitance tank circuit) oscillators. At low frequencies, the absolute phase noise can be very low compared with the same type of oscillators at higher-frequency signal sources being improved by the methods described in this patent document. The phase detector circuits shown in FIGS. 2 and 3 therefore become more practical, where the VCXO 204 can be replaced by an LC VCO. The phase locked loop type FM detector, which also contains a VCO, again becomes more practical. In the phase locked loop type. FM demodulator, the demodulated signal (in this case the undesired phase noise and spurious phase contamination) appear as the VCO control voltage.

Figure 12:
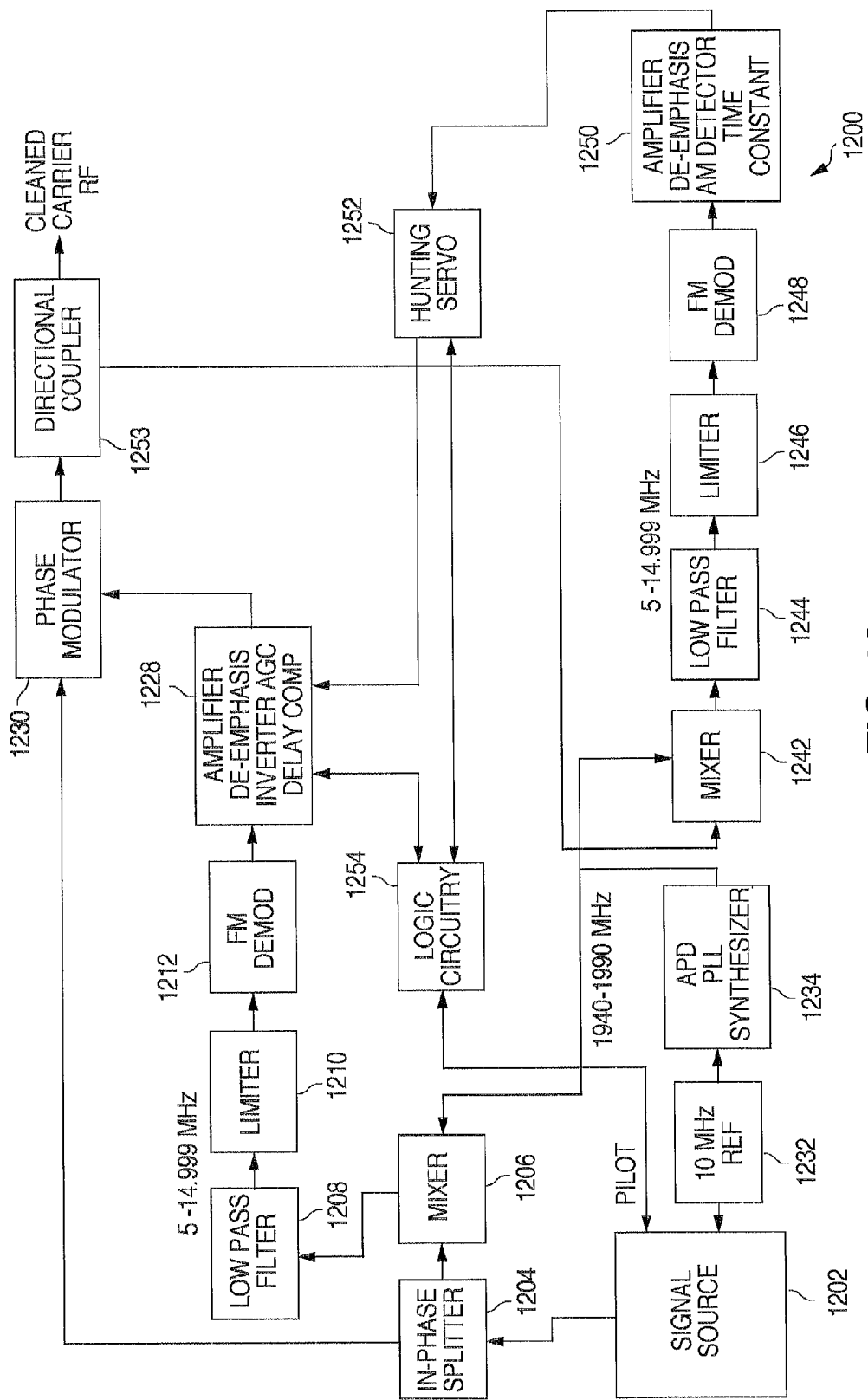
FIG. 12 illustrates an example system for performing signal cancellation to reduce phase contamination of a signal using feedback according to this disclosure.

FIG. 12 illustrates an example system 1200 for performing signal cancellation to reduce phase contamination of a signal using feedback according to this disclosure. The various systems described above have generally used a technique to cancel or partially cancel phase noise and other unwanted angle-modulated energy within a signal from a signal source. This can be supplemented with a technique to automatically adjust the level of the inverted baseband signal feeding a phase modulator to obtain even more or maximum possible cancellation and to permit implementations that are more practical to manufacture.

An example of this is shown in FIG. 12, where some aspects of the architecture are similar to that of the system 1100. For example, the components 1202-1210 could be the same as or similar to the components 1102-1110 in FIG. 11. Also, an FM demodulator 1212 could collectively represent the components 1112-1126 from FIG. 11, although any suitable FM demodulator could be used. Further, circuitry 1228 can be similar to the circuitry 1128 in FIG. 11. However, the circuitry 1228 here further includes automatic gain control (AGC) and delay compensation circuitry, which regulates the level and phase of the inverted baseband signal fed to a phase modulator 1230. In addition, a reference source 1232 could be the same as or similar to the reference source 1132, and an aperture phase detector (APD) type PLL synthesizer 1234 could represent the components 1134-1140 in FIG. 11.

In this example, phase noise and other contamination are demodulated both before and after the phase modulator 1230. Namely, the components 1206-1228 demodulate the phase noise and other contamination before the phase modulator 1230, and components 1242-1250 demodulate the phase noise and other contamination after the phase modulator 1230 in a similar manner. However, circuitry 1250 here includes AM envelope detection and time constant circuitry to deliver a varying DC voltage that represents the level of remaining phase noise and other contamination. This may be similar in design to subsystem blocks of the phase noise measurement instruments described in U.S. Pat. No. 7,809,517. The circuitry 1250 does not perform inversion and AGC functions. The auxiliary reference source 1232 here services both subsystems (components 1206-1228 and components 1242-1252). A directional coupler 1253 provides at least a portion of the output from the phase modulator 1230 to the mixer 1242.

A hunting servo 1252 delivers the DC output of the circuitry 1250 as an AGC control voltage to the circuitry 1228 for automatic gain control. The AGC control voltage can help to reduce or minimize the detected amount of phase noise and other contamination in the signal output by the phase modulator 1230. The servo 1252 is described as "hunting" to indicate that the servo system may not receive a signed "error" signal (a signal that indicates whether the instantaneous inverted signal to the modulator 1230 is too high or too low). Rather, the correct value can be reached by first incrementing the adjustment in one direction to determine which direction to slew, slewing in that direction until slight overshooting is noted, and then returning to the correct value. Such techniques are commonly used, for instance, for pointing high gain antennas and controlling solar energy harvesting arrays to obtain maximum power points. It should be understood that once the correct value is found, the correcting mechanism and AGC value could be frozen. Once the minimum phase contamination value has been found by optimizing the phase modulator's input level, for some applications a control system (specifically a logic element 1254) can vary the time delay for modulating frequencies exceeding 10 MHz to maintain 180° phase shift between the modulating signal and the signal coming from the signal source 1202 and the splitter 1204.

The detection subsystem (components 1242-1252) that follows the modulator 1230 appears to have a greater burden than the other detection subsystem (components 1206-1228). For example, the detection subsystem (components 1242-1252) processes a smaller amount of phase noise and other contamination. However, its ability to detect a small signal can be greatly enhanced by processing an averaged value rather than an instantaneous value. Moreover, determination of the correct modulating signal value to provide maximum cancellation can be augmented by inserting (either continuously or temporarily) a large pilot tone to modulate the signal source 1202. This can be done using the logic element 1254, which uses outputs of the circuitry 1228 and servo 1252 to generate the pilot tone. As a particular example, the pilot signal can be used to deliberately contaminate the signal source 1202 to help simplify the post-modulator detector, and the pilot signal can be turned off once the correct modulation level has been implemented.

In particular embodiments of the various systems shown in FIGS. 1 through 12, a phase noise improvement of 10 dB to 20 dB could be achievable for phase noise sideband ranges between 100 Hz and tens of MHz. The final value of phase noise and spurious contamination after the signal cancellation process is relatively independent of the initial amount. As a result, synthesizers designed to achieve small channel spacing, fast locking, and other specifications that make it difficult to obtain low phase noise and spurious contamination can be designed without regard to these degradations. Any of these systems could also incorporate techniques for automatically adjusting its baseband modulation signal level. It should be noted that the cancellation phase modulator does not need to be adjusted for the correct modulation input level continuously, as do feedback systems within most frequency synthesizers. In addition, any suitable skirt network slope detectors, asynchronous envelope detectors, quadrature phase shift networks, and other FM detectors could be used (such as RF MEMS or integrated free-standing bulk acoustic resonator structures).

Although FIGS. 1 through 12 illustrate examples of systems for performing signal cancellation to reduce phase contamination of a signal, various changes may be made to FIGS. 1 through 12. For example, each component in any of these systems can be implemented using any suitable structure(s) for performing the described function(s). Also, the functional division shown in each figure is for illustration only. Various components in each figure could be combined, further subdivided, or omitted and additional components could be added according to particular needs. Further, various components used in one or some of the figures could be used in other figures.

Moreover, note that while the signal source is each system is shown as a local source, the removal of unwanted phase contamination could occur at any suitable location, even at a location remote from a signal source. Decontamination can be performed at a remote location, for example, since the signal from the signal source could acquire additional noise and spurious deterministic modulation. Beyond that, while the signal sources are routinely described as providing unmodulated source signals, an intentionally modulated (and possibly remotely located) carrier can have its modulation stripped away to form a coherent carrier before processing by these systems. In addition, many types of monochromatic signal synthesizers can be designed for better performance in other ways, such a faster frequency slew rates or narrower channel spacings if post-generation cleanup can be done.

Note that in this document, the phrase "phase contamination" refers to any angle modulation of a signal. This phrase includes phase noise, period jitter, and spurious components.

Figure 13:
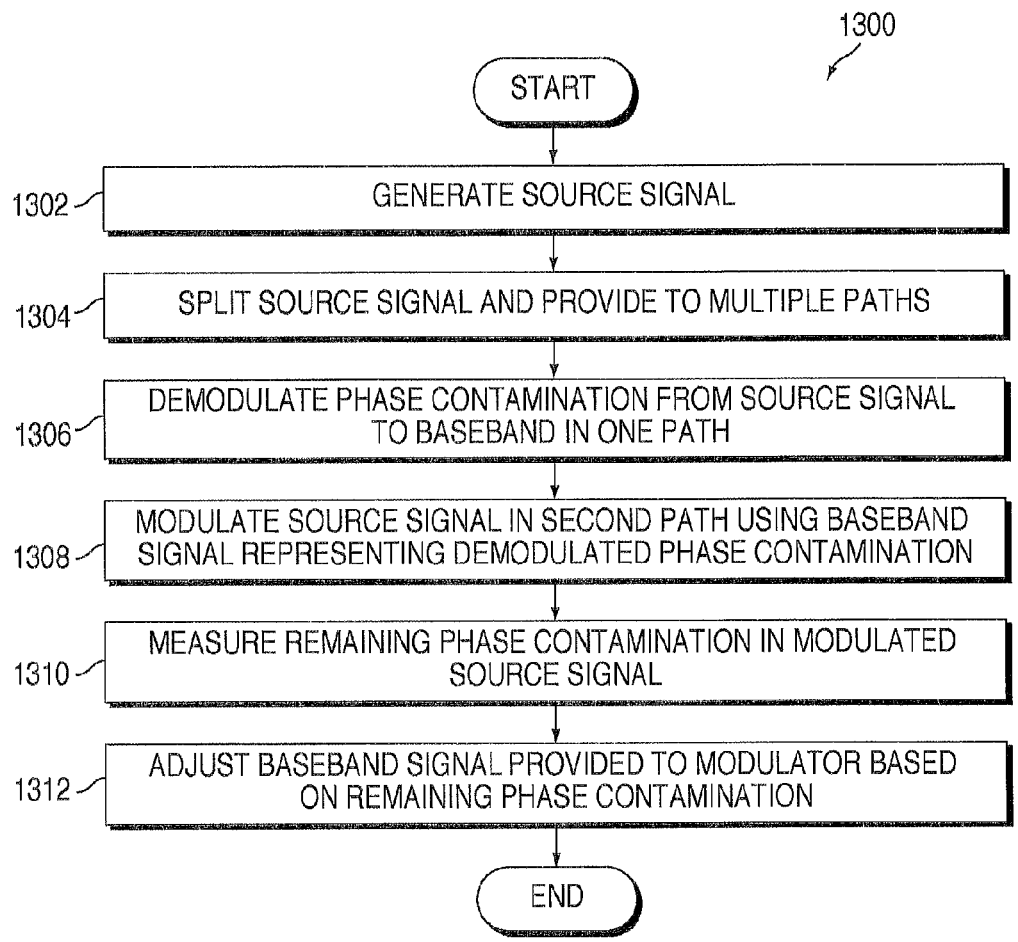
FIG. 13 illustrates an example method for performing signal cancellation to reduce phase contamination of a signal according to this disclosure.

FIG. 13 illustrates an example method 1300 for performing signal cancellation to reduce phase contamination of a signal according to this disclosure. The method 1300 shown here could be used by any of the systems described above or by any other suitably-arranged system.

As shown in FIG. 13, a source signal is generated at step 1302, and the source signal is split and provided to multiple signal processing paths at step 1304. The source signal could be generated using any suitable source, and the source signal could be split in any suitable manner.

Phase contamination in one split portion of the source signal is demodulated to baseband in one signal processing path at step 1306. This could be done using a phase detector or an FM detector (such as a delay line discriminator, quadrature detector, or slope detector) or in any other suitable manner. Another split portion of the source signal is modulated using the baseband signal containing the demodulated phase contamination in another processing path at step 1308. This could include, for example, using a phase or frequency modulator that receives both a split portion of the source signal and the phase contamination at baseband.

Optionally, any remaining phase contamination in the modulated signal is measured at step 1310, such as by using components 1242-1250 that demodulate the phase noise and other contamination in the output of the phase modulator 1230. This can be used as feedback, such as to adjust the baseband signal that is provided to the phase modulator, at step 1312.

Although FIG. 13 illustrates one example of a method 1300 for performing signal cancellation to reduce phase contamination of a signal, various changes may be made to FIG. 13.

For example, while shown as a series of steps, various steps in FIG. 13 could overlap, occur in parallel, or occur any number of times.

In general, the systems and method described above separate phase noise reduction (short-term stability) from maintenance of long-term stability normally done in PLLs and FLLs. The reduction in phase noise, period jitter, or other contamination can be made down to essentially the same level of final phase noise, regardless of the original amount of phase noise present in the original source signal. This permits clean-up of target synthesizers having relatively high phase noise due to very narrow channel spacing or other reasons. Note that in the above examples, particular voltages, frequencies, noise levels, gains, resistances, capacitances, and other values are shown. Other embodiments could use different system components, voltages, frequencies, noise levels, gains, resistances, capacitances, and other values depending on the implementation. In addition, note that the values given above (such as voltages, frequencies, noise levels, etc.) are approximate values only.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method employable to cancel phase contamination of an input signal, comprising:
   receiving the input signal;
   demodulating phase contamination in the input signal to generate a baseband phase contamination signal including:
      demodulating the phase contamination using a phase demodulator; and
      inverting and amplifying the demodulated phase contamination; and
   modulating the input signal based on the baseband phase contamination signal to generate an output signal, the output signal having less phase contamination than the input signal.

2. The method of claim 1, further comprising:
   splitting the input signal into first and second portions;
   wherein demodulating the phase contamination in the input signal comprises demodulating phase contamination in the first portion of the input signal; and
   wherein modulating the input signal based on the baseband phase contamination signal comprises modulating the second portion of the input signal based on the baseband phase contamination signal.

3. The method of claim 1, wherein demodulating the phase contamination in the input signal comprises demodulating the phase contamination using a frequency modulation (FM) detector.

4. The method of claim 3, wherein demodulating the phase contamination using the FM detector comprises using one of: a slope detector, a delay line discriminator, a quadrature detector, a Foster Seeley detector, and a ratio detector.

5. The method of claim 3, further comprising:
splitting the input signal into first and second portions; and
down-converting the first portion of the input signal to a lower frequency;
wherein demodulating the phase contamination in the input signal comprises demodulating phase contamination in the down-converted first portion of the input signal.

6. The method of claim 1, wherein the output signal has less phase noise or period jitter than the input signal.

7. The method of claim 1, further comprising:
demodulating remaining phase contamination in the output signal to generate a feedback phase contamination signal; and
regulating a level of the baseband phase contamination signal used during modulation of the input signal based on the feedback phase contamination signal.

8. An apparatus operable to cancel phase contamination of an input signal, comprising:
a phase contamination demodulator configured to demodulate phase contamination in the input signal and generate a baseband phase contamination signal including
demodulating the phase contamination in the input signal; and
inverting and amplifying the demodulated phase contamination; and
a modulator configured to modulate the input signal based on the baseband phase contamination signal and generate an output signal having less phase contamination than the input signal.

9. The apparatus of claim 8, further comprising:
a splitter configured to split the input signal into first and second portions;
wherein the phase contamination demodulator is configured to receive the first portion of the input signal; and
wherein the modulator is configured to receive the second portion of the input signal.

10. The apparatus of claim 8, wherein the phase contamination demodulator comprises a frequency modulation (FM) detector.

11. The apparatus of claim 8, further comprising:
a mixer configured to mix an output signal from an auxiliary synthesizer and a portion of the input signal to down-convert the portion of the input signal to a lower frequency;
wherein the phase contamination demodulator is configured to demodulate phase contamination in the down-converted portion of the input signal.

12. The apparatus of claim 11, wherein the auxiliary synthesizer comprises an aperture phase comparator.

13. The apparatus of claim 8:
further comprising a feedback phase contamination demodulator configured to demodulate remaining phase contamination in the output signal and generate a feedback phase contamination signal; and
the phase contamination demodulator further configured to regulate a level of the baseband phase contamination signal provided to the modulator based on the feedback phase contamination signal.

14. A system operable to cancel phase contamination of an input signal comprising:
a signal source configured to generate the input signal;
a phase contamination demodulator configured to demodulate phase contamination in the input signal and generate a baseband phase contamination signal including:
demodulating the phase contamination in the input signal; and
inverting and amplifying the demodulated phase contamination; and
a modulator configured to modulate the input signal based on the baseband phase contamination signal and generate an output signal having less phase contamination than the input signal.

15. The system of claim 14, wherein the phase contamination demodulator comprises a frequency modulation (FM) detector.

16. The system of claim 14:
further comprising a feedback phase contamination demodulator configured to demodulate remaining phase contamination in the output signal and generate a feedback phase contamination signal; and
the phase contamination demodulator further configured to regulate a level of the baseband phase contamination signal provided to the modulator based on the feedback phase contamination signal.

17. The system of claim 16, wherein the feedback phase contamination demodulator is further configured to:
generate a pilot signal to modulate the signal source and intentionally contaminate the input signal; and
once a predetermined level of the baseband phase contamination signal provided to the modulator in response to the pilot signal is determined, turn off the pilot signal.

* * * * *